US010120050B2

(12) United States Patent
Feiweier

(10) Patent No.: US 10,120,050 B2
(45) Date of Patent: *Nov. 6, 2018

(54) SLICE-SPECIFIC PHASE CORRECTION IN SLICE MULTIPLEXING

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 1272 days.

This patent is subject to a terminal disclaimer.

(21) Appl. No.: 13/856,586

(22) Filed: Apr. 4, 2013

(65) Prior Publication Data

US 2013/0285656 A1    Oct. 31, 2013

(30) Foreign Application Priority Data

Apr. 4, 2012 (DE) .................. 10 2012 205 587

(51) Int. Cl.
*G01R 33/56* (2006.01)
*G01R 33/483* (2006.01)
(Continued)

(52) U.S. Cl.
CPC ......... *G01R 33/56* (2013.01); *G01R 33/4835* (2013.01); *G01R 33/56572* (2013.01);
(Continued)

(58) Field of Classification Search
USPC .......................... 324/300–322; 600/407–435
See application file for complete search history.

(56) References Cited

U.S. PATENT DOCUMENTS 5,189,369 A    2/1993  Takane et al.
5,406,203 A    4/1995  Oh et al.
(Continued)

FOREIGN PATENT DOCUMENTS

JP    H0779941 A    3/1995
JP    H08299299 A   11/1996
(Continued)

OTHER PUBLICATIONS

Yang et al., "Removal of Local Field Gradient Artifacts in T2*—Weighted Images at High Fields by Gradient-Echo Slice Excitation Profile Imaging," MRM, vol. 39 (1998), pp. 402-409.
(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method to correct a signal phase in the acquisition of MR signals of an examination subject in a slice multiplexing method, in which MR signals from at least two different slices of the examination subject are detected simultaneously in the acquisition of the MR signals, a linear correction phase in the slice selection direction is determined for each of the at least two slices. An RF excitation pulse with a slice-specific frequency is radiated in each of the at least two different slices. A slice selection gradient is activated during a slice selection time period, during which the different RF excitation pulses are radiated in the at least two different slices, and the slice selection time period has a middle point in time in the middle of the slice selection time period, and the different RF excitation pulses temporally overlap for the at least two different slices. A time offset of the RF excitation pulse relative to the middle point in time for each of the RF excitation pulses is determined, such that a slice-specific correction gradient moment in the slice selection direction
(Continued)

that corresponds to the linear correction phase of the respective slice acts on the magnetization of the respective slice.

13 Claims, 5 Drawing Sheets

(51) Int. Cl.
*G01R 33/28* (2006.01)
*G01R 33/565* (2006.01)

(52) U.S. Cl.
CPC ...... *G01R 33/288* (2013.01); *G01R 33/56563* (2013.01); *G01R 33/56581* (2013.01)

(56) References Cited

U.S. PATENT DOCUMENTS

| | | | |
|---|---|---|---|
| 5,422,572 A | 6/1995 | Yao | |
| 6,008,647 A | 12/1999 | Zhou et al. | |
| 6,618,607 B2 * | 9/2003 | Song | G01R 33/4806 324/312 |
| 8,723,517 B2 * | 5/2014 | Takahashi | G01R 33/4816 324/307 |
| 9,414,766 B2 | 8/2016 | Jesmanowicz et al. | |
| 9,599,690 B2 * | 3/2017 | Feiweier | G01R 33/4835 |
| 9,651,640 B2 * | 5/2017 | Feiweier | G01R 33/4835 |
| 2002/0047708 A1 | 4/2002 | Miyoshi et al. | |
| 2002/0135366 A1 | 9/2002 | Heubes | |
| 2002/0167319 A1 | 11/2002 | Ikezaki | |
| 2004/0064032 A1 | 4/2004 | Ma | |
| 2005/0017719 A1 | 1/2005 | Heubes | |
| 2007/0007960 A1 | 1/2007 | King et al. | |
| 2007/0080685 A1 * | 4/2007 | Bydder | G01R 33/561 324/309 |
| 2007/0229071 A1 | 10/2007 | Heid | |
| 2008/0071167 A1 | 3/2008 | Ikedo et al. | |
| 2008/0258723 A1 | 10/2008 | Abe | |
| 2010/0286802 A1 | 11/2010 | Feiweier et al. | |
| 2011/0133736 A1 | 6/2011 | Zhong | |
| 2011/0245655 A1 * | 10/2011 | Abe | G01R 33/4816 600/410 |
| 2013/0057280 A1 | 3/2013 | Feiweier | |
| 2013/0057281 A1 | 3/2013 | Feiweier | |
| 2013/0285656 A1 * | 10/2013 | Feiweier | G01R 33/56 324/309 |
| 2018/0059199 A1 * | 3/2018 | Feiweier | G01R 33/4835 |

FOREIGN PATENT DOCUMENTS

| | | |
|---|---|---|
| KR | 102004001703 A | 2/2004 |
| KR | 20110075859 A | 7/2011 |
| WO | WO-96/10755 A1 | 4/1996 |

OTHER PUBLICATIONS

Larkman et al., "Use of Multicoil Arrays for Separation of Signal from Multiple Slices Simultaneously Excited," Journal of Magnetic Resonance Imaging, vol. 13 (2001), pp. 313-317.
Deng et al., "Simultaneous Z-Shim Method for Reducing Susceptibility Artifacts With Multiple Transmitters," Magnetic Resonance in Medicine, vol. 61 (2009), pp. 255-259.
Feinberg et al., "Simultaneous Echo Refocusing in EPI," Magnetic Resonance in Medicine, vol. 48 (2002), pp. 1-5.
Wu et al., "Wideband MRI: A New Dimension of MR Image Acceleration," Proc. Intl. Soc. Mag. Reson. Med., vol. 17 (2009), p. 2678.
Meier et al., "Concomitant Field Terms for Asymmetric Gradient Coils: Consequences for Diffusion, Flow, and Echo-Planar Imaging," Magnetic Resonance in Medicine, vol. 60 (2008), pp. 128-134.
Souza et al., "SIMA: Simultaneous Multislice Acquisition of MR Images by Hadamard-Encoded Excitation," Journal of Computer Assisted Tomography, vol. 12, No. 6 (1988), pp. 1026-1030.
Lu et al., "SEMAC: Slice Encoding for Metal Artifact Correction in MRI," Magnetic Resonance in Medicine, vol. 62 (2009), pp. 66-76.
Zwanger et al., "Compensation for Maxwell Cross-Terms in Diffusion-Weighted Imaging" Proc. Intl. Soc. Mag,.Reson. Med. 11 (2004), p. 101.

* cited by examiner

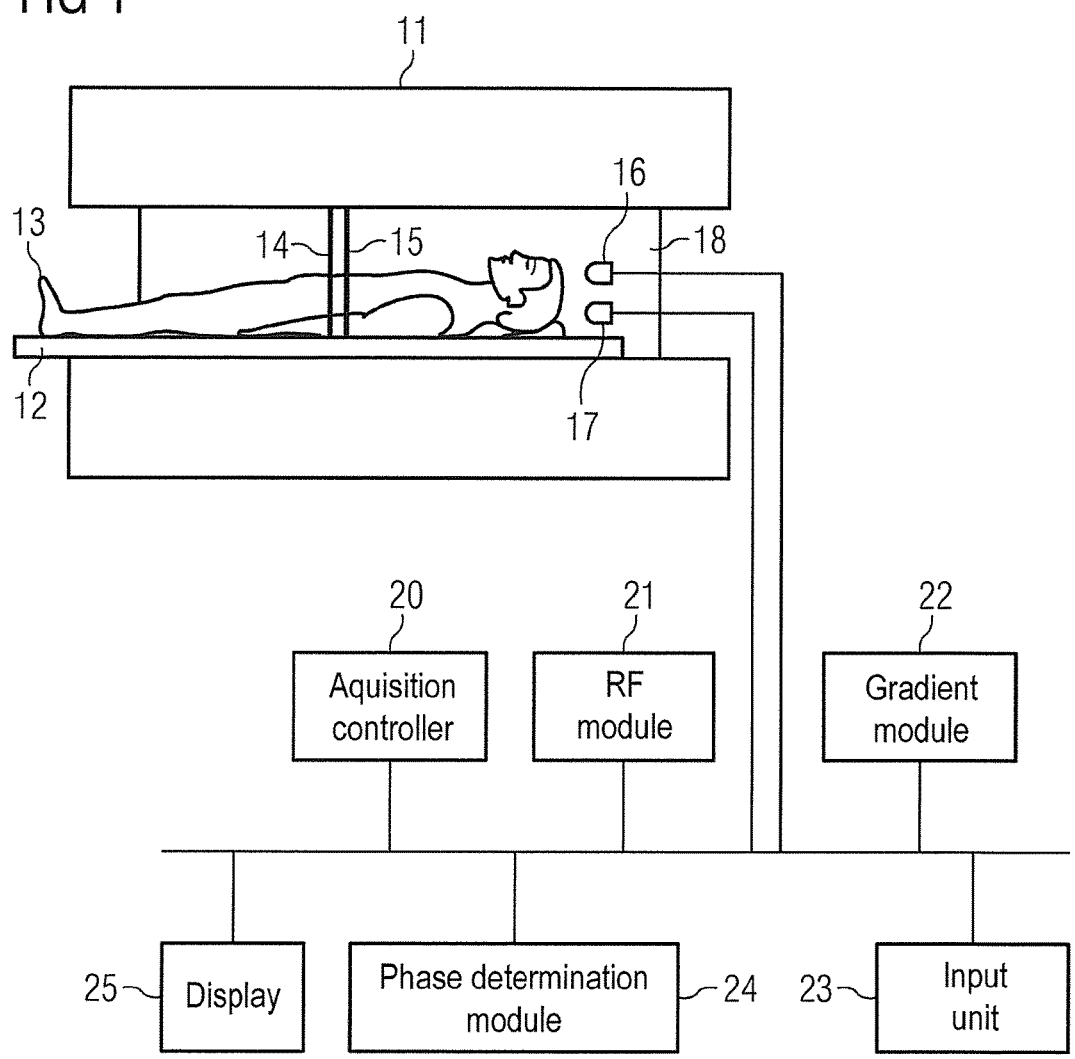

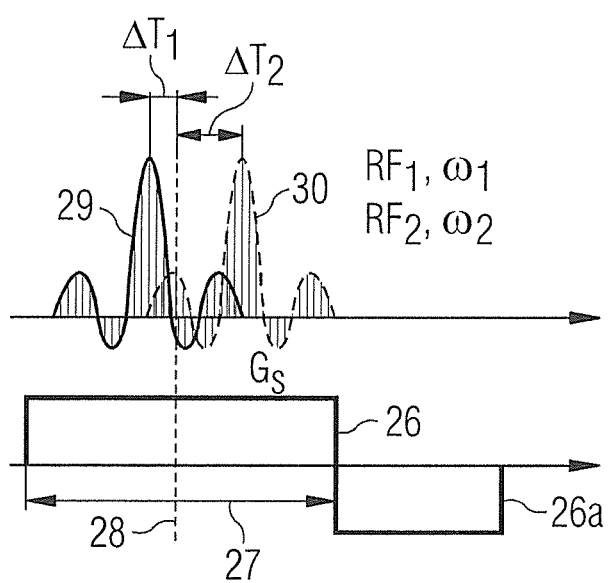

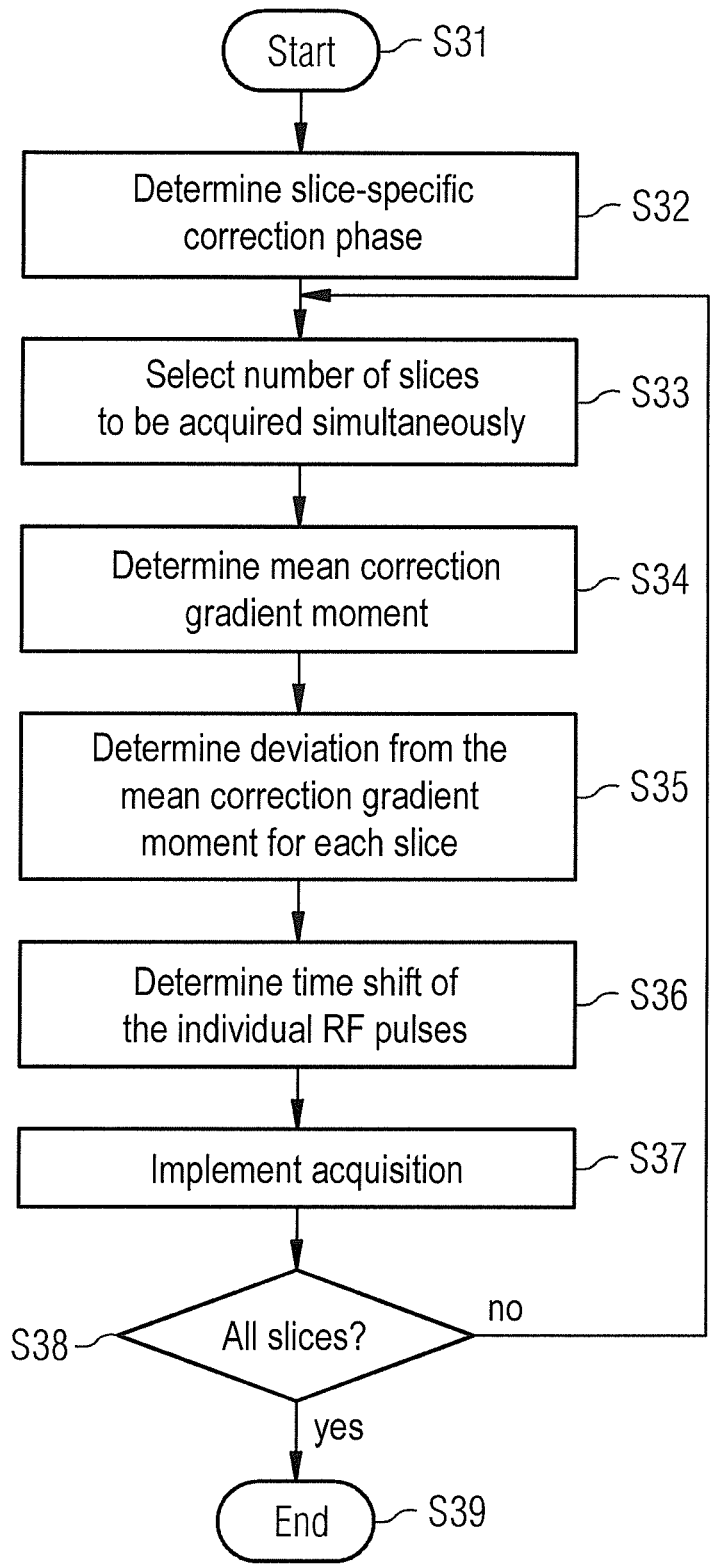

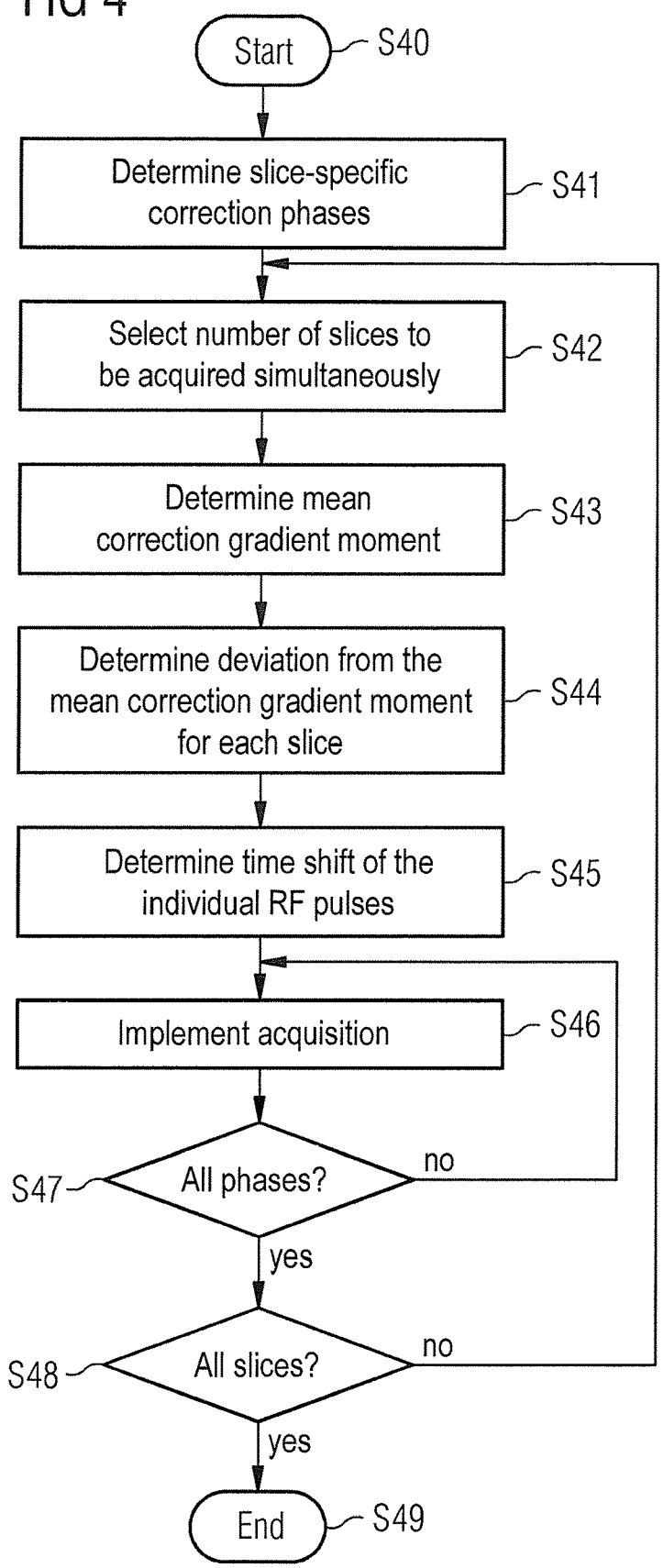

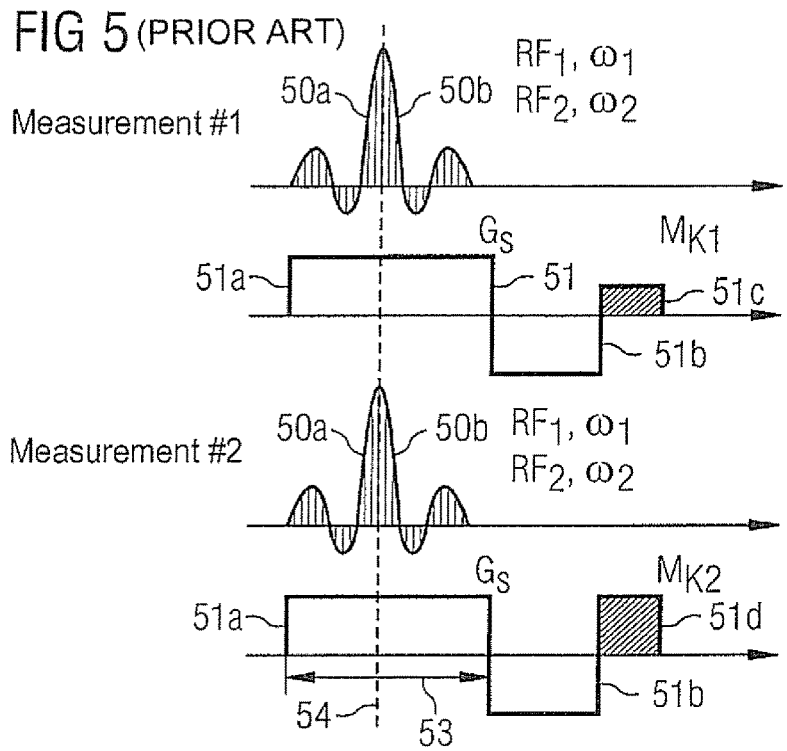
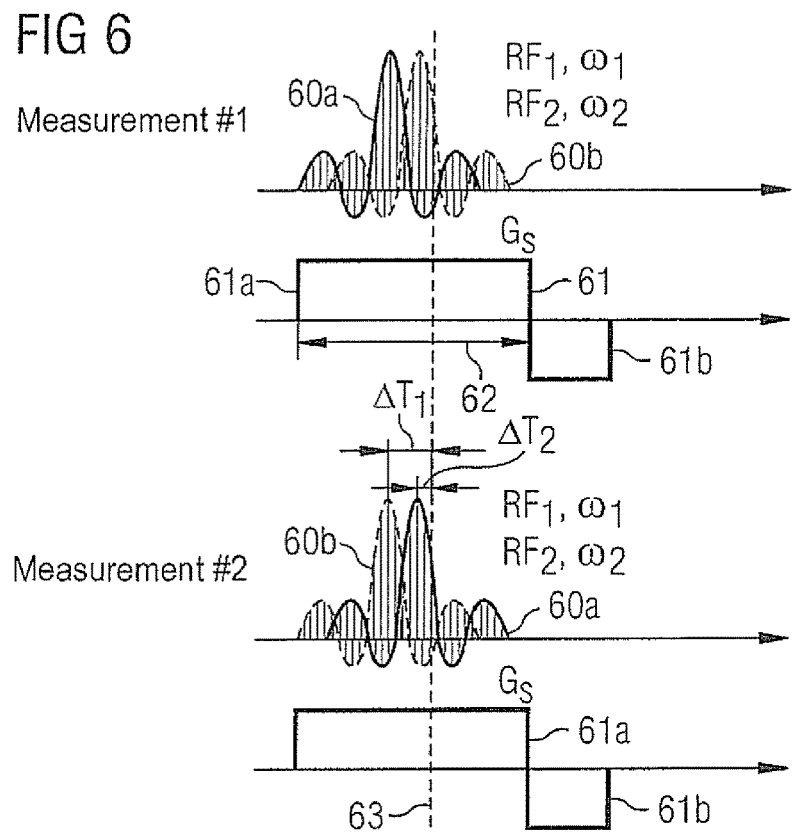

SLICE-SPECIFIC PHASE CORRECTION IN SLICE MULTIPLEXING

BACKGROUND OF THE INVENTION

Field of the Invention

The present invention concerns a method to correct a signal phase in the acquisition of MR signals of an examination subject in a slice multiplexing method, and an MR system for implementing such a method.

Description of the Prior Art

The desire for ever faster MR acquisitions in the clinical environment is currently leading to a renaissance of methods in which multiple images are acquired simultaneously. In general, these methods can be characterized in that transverse magnetization of at least two slices is specifically used simultaneously for the imaging process ("multislice imaging", "slice multiplexing"), at least during a portion of the measurement. In contrast to this, in the established "multislice imaging" the signal is acquired from at least two slices in alternation, i.e. completely independently of one another with correspondingly longer measurement time. For example, the following are among such slice multiplexing methods:

Hadamard coding (for example Souza et al., J. CAT 12:1026 (1988)): two (or more) slices are excited simultaneously, a defined signal phase is impressed on each slice via corresponding design of the RF excitation pulses. The signal of the magnetization is received simultaneously from both slices. A similar second excitation of both slices is implemented, but with different relative signal phase in the slices. The remaining imaging process (phase coding steps) takes place in a conventional manner; the method can be combined with any acquisition techniques ((multi-)gradient echo, (multi-) spin echo etc.). The signal information of both slices can be separated from the two exposures by means of suitable computing operations.

Simultaneous echo refocusing (SER, SIR, for example Feinberg et al., MRM 48:1 (2002)): two (or more) slices are excited simultaneously. The signal of the magnetization is received simultaneously from both slices. During the data acquisition, a gradient is activated along the slice normals, which leads to a separation of the signals of both slices in frequency space. The remaining imaging process (phase coding steps) takes place in a conventional manner; the method can be combined with any acquisition techniques ((multi-)gradient echo, (multi-) spin echo etc.). Images of both slices can be separated from the simultaneously acquired data by means of suitable computing operations.

Broadband data acquisition (for example Wu et al., Proc. ISMRM 2009:2768): two (or more) slices are excited simultaneously. The signal of the magnetization is received simultaneously from both slices. During the data acquisition, a gradient is activated along the slice normals, which leads to a separation of the signals of both slices in frequency space. The remaining imaging process (phase coding steps) takes place in a conventional manner; the method can be combined with any acquisition techniques ((multi-)gradient echo, (multi-) spin echo etc.). The signals of both slices can be separated from the simultaneously acquired data by means of suitable filtering.

Parallel imaging in the slice direction (for example Larkman et al., JMRI 13:313 (2001)): two (or more) slices are excited simultaneously. The signal of the magnetization is received simultaneously from both slices with at least two (or more) coil elements. The remaining imaging process (phase coding steps) takes place in a conventional manner; the method can be combined with any acquisition techniques ((multi-)gradient echo, (multi-) spin echo etc.). An additional calibration measurement is implemented to determine the spatial acquisition characteristic of the coil elements. The signals of both slices can be separated from the simultaneously acquired data by means of suitable computer operations (GRAPPA algorithm, for example).

Furthermore, in single slice imaging it may be necessary to correct image artifacts given which the correction parameters depend strongly on the spatial position or on the signal of the individual slices. An example of this is the correction of phase errors that arise due to accompanying Maxwell fields. These phase errors arise in that there is no complete linearity of the magnetic field gradient upon switching of a linear magnetic field gradient; rather higher-order terms always arise. These fields—known as Maxwell fields—lead to phase errors in the detected MR signals. One possibility for correction is described in Meier et al., MRM 60:128 (2008). Likewise, in single slice imaging it is sometimes necessary to correct local inhomogeneities of the basic magnetic field that would lead to signal cancellations or image distortions. The correction of such inhomogeneities is described in Deng et al., MRM 61:255 (2009) and in Lu et al., MRM 62:66 (2009), for example.

In many cases of slice-specific correction in single-slice exposures it is sufficient to merely impress an additional linear signal phase along the slice coding. Using various examples it is subsequently explained why the impression of a linear signal phase is sufficient in many cases:

a) One possibility of application of a linear correction is the correction of phase errors in diffusion imaging that are due to Maxwell fields.

MRM 60:128 (2008) describes how the accompanying fields of the Maxwell fields of the diffusion coding gradients lead to an additional signal dephasing along the three spatial coordinate axes. Dephasings along the frequency and phase coding axis merely lead to a displacement of the signal in k-space—the echo is no longer acquired at k=0, but rather at a (slightly) shifted position. An echo shift in k-space corresponds in positional space (after the Fourier transformation) to a linear phase response in the image; insofar as only magnitude images are of interest, this effect only plays a subordinate role. Moreover, by the acquisition of a sufficiently large k-space region (omitting partial Fourier techniques, for example) it can be ensured that the echo signal is located in the scanned region in every case.

However, dephasing along the slice selection axis directly leads to a signal loss that cannot be compensated. The magnitude of the dephasing thereby depends on the amplitude of the accompanying Maxwell fields (and thus on the position of the slice). Given simultaneous acquisition of multiple slices, an individual dephasing is to be corrected for every slice. In the first order, the dephasing can be described by a linear phase response.

b) A linear phase correction is likewise sufficient given the correction of the phase errors of flow imaging that are due to the Maxwell fields.

As in the preceding example, this example relates to the compensation of dephasings due to accompanying Maxwell fields—here caused by the gradients used for the flow coding. The statements regarding the motivation of a linear, slice-specific correction phase along the slice coding axis analogously apply to this example. The uncorrected linear phase response in the image (due to the shift of the echo in k-space) can be taken into account in the data processing in a simple manner.

c) A linear correction is likewise possible to correct local inhomogeneities of the basic magnetic field and the signal cancellations that are caused by these (z-shim).

MRM 61:255 (2009) (and the references cited therein—in particular in Yang et al., MRM 39:402 (1998)) describe how imaging errors in echoplanar gradient echo imaging that are caused by inhomogeneities of the basic magnetic field can be reduced by repeated implementation of the measurement with different auxiliary gradients in the slice coding direction. These are (local) magnetic field gradients that lead to a dephasing of the signal along the three spatial coordinate axes. Again, it is only the gradient along the slice coding direction that has the largest effect on the image quality due to the signal loss within a voxel (intra-voxel dephasing) associated with this gradient direction. The known z-shim method varies a background gradient from measurement to measurement in order to ensure a good rephasing of each slice in at least one measurement for each every spatial region. The multiple images of a slice are merged into an image with reduced signal cancellations, either by a simple averaging (absolute mean value, "sum of squares") or by more complicated combination methods.

d) Linear phase correction can likewise be applied in the correction of signal cancellations and image distortions that result due to local inhomogeneities of the basic magnetic field (SEMAC).

MRM 62:66 (2009) describes how signal cancellations and image distortions in 2D imaging that are due to metal implants (or, respectively, the local inhomogeneities of the basic magnetic field that are connected with these) can be reduced via use of a (limited) additional phase coding along the slice normal. Similar to the case of a z-shim, multiple measurements with different auxiliary gradients in the slice coding direction are acquired per slice, and these data are combined in a suitable manner.

SUMMARY OF THE INVENTION

Starting from the prior art identified above, it is an object of the present invention to provide a linear phase correction in a slice multiplexing method in a simple manner, wherein the specific absorption rate (SAR) and the peak RF power of the radiated RF pulses are minimized at the same time.

According to the invention, a method is provided to correct a signal phase in the acquisition of MR signals of an examination subject in a slice multiplexing method, in which method the MR signals from at least two different slices of the examination subject are detected in the acquisition of the MR signals. In the method, a linear correction phase in the slice selection direction is determined for each of the at least two slices. Furthermore, an RF excitation pulse with a slice-specific frequency is radiated in each of the least two different slices that are acquired simultaneously. A slice selection gradient is likewise switched during a slice selection time period, during which the different RF excitation pulses are radiated for the at least two different slices. The slice selection time period has a middle point in time in the middle of the slice selection time period. Furthermore, the different RF excitation pulses, which are radiated during the slice selection time period for the two different slices, overlap. A time offset of the respective RF excitation pulse relative to the middle point in time of the slice selection time period is determined for each of the RF excitation pulses, such that a slice-specific correction gradient moment in the slice selection direction, which moment corresponds to the linear correction phase of the respective slice, acts on the magnetization of the respective slice.

Due to the time offset of the different RF pulses during the application of the slice selection gradient, an easily differentiated coherency path of the excited spins results for each slice excited by the RF pulses. The signal that is excited or refocused by RF pulses applied earlier in time experiences a stronger or different influence due to the additionally applied slice selection gradient than the signal from RF pules that are applied later in time. By determination of the time offset, the linear correction phase or the linear correction gradient moment can be determined individually for each slice, which is necessary in order to achieve the desired linear correction in the respective slice. Since the linear phase correction is not the same in all slices, and thus the time offset of the RF pulses is not the same, a reduction of the SAR (specific absorption rate) is achieved at the middle point in time by the different time offset of the RF excitation pulse in the slice selection time period. The SAR depends quadratically on the applied pulse voltage and the necessary peak RF power. If the pulse envelopes to excite two slices were radiated simultaneously, they would additively superimpose. If both maxima were to be situated at the same position, a doubled peak RF amplitude would be required and thus would generate four times the SAR. By displacement of the maxima for the individual slices, the correction gradient moment required for the respective slice can be applied, and the SAR can be significantly reduced.

The linear correction phase that is necessary for each individual slice can be analytically calculated beforehand depending on the application, or can be determined with previous measurements.

For example, for the correction of linear phase errors due to Maxwell fields, the mean field gradient prevailing for each slice is initially determined along the slice normal, for example. This can be calculated on the basis of the information in MRM 60:128 (2008) by the equation for the magnitude of the field amplitude being developed with the actual slice position $z=z_s$ up to the first magnitude.

For example, for the correction of linear phase errors due to inhomogeneities of the basic field, the user can specify a region for which a linear field gradient along the slice normal should be concerned. Moreover, the user can specify the resolution to be used, i.e. the number of auxiliary gradients that are to be used for each slice. Alternatively, it is possible for a measurement of the inhomogeneities of the basic field to initially take place by means of MR methods known to those skilled in the art. The field map that is obtained in such a manner can be evaluated along the slice normal for each slice S with regard to the mean field gradients. The width of the distribution of this field gradient can also be determined in such a manner. The data obtained in such a manner can be used in order to individually determine the auxiliary gradients to be used for each slice.

In one embodiment it is possible to calculate the time offset for the respective slice directly depending on the linear correction phase necessary for this slice, and to apply the RF pulse with the calculated time offset. In another embodiment, it is possible to determine the correction gradient moment belonging to each of the different slices, wherein a mean correction gradient moment that is applied to all of the at least two different slices is determined using the correction gradient moment belonging to each slice. Furthermore, deviation of the corresponding slice-specific correction gradient moment is then determined from the mean correction gradient moment for each of the different slices. This deviation corresponds to a slice-individual auxiliary gradient moment. For each of the different slices, the time offset can then be calculated such that the slice-individual auxiliary gradient moment acts on the respective slice. By use of the mean correction gradient moment that is applied to all slices and the use of the slice-individual auxiliary gradient moment, the slice-individual auxiliary gradient moment is typically smaller than the correction gradient moment belonging to each slice. The time offset of the RF excitation pulses relative to the middle point in time can be reduced so that the time period can be reduced overall, which shortens the acquisition of the MR signals.

In an additional step, it is possible to select the number of slices to be simultaneously acquired depending on at least one selection criterion. For example, the optimally good separability of the slices can be used as a selection criterion in the aliasing process. This is typically achieved by a sufficiently large interval of the slices. The aliasing process serves to separate the simultaneously acquired MR signals of the different slices. A different criterion would be an optimally large similarity of the necessary slice correction gradient moment in order to need to shift the RF pulses as little as possible contrary to one another. An additional possibility is to achieve a minimal difference of the necessary slice correction gradient moment, which is why a minimum interval of the RF pulses is ensured for SAR reduction. These different selection criteria can also be arbitrarily combined with one another, or be used individually.

In one embodiment, with the slice-specific correction gradient moment the dephasing along the slice direction due to the Maxwell fields is corrected with the linear correction phase.

Given the use of a mean correction gradient moment, this can be impressed in the at least two different slices by switching an additional correction gradient in the slice direction. For example, this additional correction gradient in the slice direction can also be superimposed on a slice rephasing gradient.

As described in the Specification preamble, methods are known in which multiple different correction gradient moments are impressed on a single slice. According to the invention, it is possible to impress all different correction gradient moments that are used in the different slices on each of the at least two slices. For example, if J correction gradient moments are impressed on each slice, with J≥2, and if N is the number of simultaneously acquired slices and N is a whole-number multiple of J, in a first step a slice-specific correction gradient moment can be impressed on each slice, wherein the first step is repeated under permutation of the slice order until the J correction gradient moments have been impressed on each slice. However, even more complex permutation schemes are also possible, for example when J is not a whole-number multiple of N.

In a further embodiment, it is possible to radiate multiple RF excitation pulses in a respective slice before the acquisition of the MR signals, wherein the multiple RF excitation pulses are radiated during respective slice selection time periods. The multiple RF excitation pulses and the associated slice selection time periods can now be selected with their respective middle points in time so that the slice-specific correction gradient moment was impressed overall on the magnetization in the respective slice after switching of the multiple RF excitation pulses.

The present method can be used not only in excitation pulses, but also, for example, in refocusing pulses as in spin echo experiments or in storage pulses, such as in stimulated echo experiments. The method can be used in the excitation of slices for imaging purposes and for spectroscopic purposes. These refocusing or storage pulses are likewise applied simultaneously with the slice selection gradients. The invention furthermore concerns an MR system that is designed to implement the above method with a module to determine the first linear correction phase or the correction gradient moment for each of the simultaneously excited slices, and an MR acquisition sequence controller that is designed to control the acquisition of the MR signals such that a slice-specific correction gradient moment in the slice selection direction—which moment corresponds to the determined linear correction phase of the respective slice—acts on the magnetization of the respective slice.

BRIEF DESCRIPTION OF THE DRAWINGS

FIG. 1 schematically illustrates an MR system with which slice-specific correction gradient moments can be impressed on the individual slices in a slice multiplexing method.

FIG. 2 schematically illustrates the time offset of two RF pulses to excite two different slices in the application of the slice selection gradient.

FIG. 3 is a flowchart when the method according to the invention is used to correct Maxwell-dependent phase errors.

FIG. 4 is a flowchart when the method is applied when different correction gradient moments are repeatedly impressed on each slice.

FIG. 5 illustrates the application of gradient moments and RF pulses according to the prior art.

FIG. 6 shows the application of RF pulses in the method to FIG. 4 according to the invention.

DESCRIPTION OF THE PREFERRED EMBODIMENTS

An MR system is schematically shown in FIG. 1, with which slice-individual gradient correction moments can be impressed on the individual slices according to the invention in a slice multiplexing method. In the present invention, the gradients in question are the magnetic field gradients for spatial coding. An MR system 10 with a magnet 11 to generate a polarization field $B_0$ is shown in FIG. 1. An examined person 13 arranged on a bed 12 is driven into the MR system. Radio-frequency coil arrangements 16 and 17 with which the MR signals can be detected from the two different slices 14 and 15 are schematically shown to detect MR image data from said first slice 14 and second slice 15. The MR system furthermore has a gradient system 18 in order to achieve a spatial coding with the RF pulses emitted by the RF coils 16 and 17. As is known, the resulting magnetization in the two slices 14 and 15 points in the direction of the basic magnetic field before radiation of RF pulses. Via the radio-frequency coils 16 and 17, radio-frequency pulses can be generated with which the magnetization in the different slices is deflected out of its steady state. The MR signals of the two slices can likewise be detected with the RF coils 16 and 17. The radiation of an RF pulse can also take place in cooperation with a whole-body RF coil (not shown) or with one of the local coils 16, 17, or with both local coils 16, 17. Separate coils can be used for the transmission of the RF pulses (whole-body coil) and for the reception of the data (local coil), but multiple transmission or reception coils can also be used.

The manner by which MR signals can in principle be detected by a sequence of magnetic field gradients and radiation of RF pulses is known to those skilled in the art and thus need not be explained in detail herein. Additional modules are provided to control the MR system, for example the acquisition controller 20 in which the time sequence of the radiation of RF pulses and magnetic field gradients is controlled depending on the selected imaging sequence. An RF module 21 is provided that controls the generation of the radio-frequency pulses depending on control signals of the acquisition controller 20. Furthermore, a gradient module 22 is provided with which the switching of the magnetic field gradients is controlled for spatial coding. An operator can control the workflow of the MR acquisition via an input unit 23, for example by selection of a suitable imaging sequence, or a suitable spectroscopy sequence in the case of MR spectroscopy. In a phase determination module 24, the correction phase is determined that should be impressed on every single slice given the simultaneous acquisition of multiple slices. As is mentioned above, for example, in diffusion imaging, flow imaging or the correction of $B_0$ field inhomogeneities it can be desirable to impress a linear signal phase on the excited slice in order to correct phase errors. For example, this linear phase to be impressed in the slices 14 and 15 can be known to the user and can be entered via the input unit 23, whereby the phase determination module then accepts the input values. Furthermore, the slice-individual phase errors can have been determined in advance measurements and be stored in the MR system, such that the phase determination module reads the previously stored, necessary phase corrections from the memory. The MR images generated with the MR system 10 can be displayed at a display unit 25. Naturally, the MR system has additional components (not shown). However, these have been omitted for reasons of clarity, and only the components that are necessary to understand the present invention are described. Likewise, it is naturally possible that the different modules and units shown in FIG. 1 are designed in a different configuration, and do not necessarily need to be designed as separate units. The different modules or units can also be combined with one another differently. Furthermore, the different units can be fashioned via hardware components or via software, or via a combination of hardware and software.

FIG. 2 shows how a slightly different coherence path results for each slice via the selection of a time offset given two RF pulses upon application of a slice selection gradient. For example, the two different slices can be the simultaneously excited slices 14 and 15 shown in FIG. 1. FIG. 2 illustrates this for the case of the simultaneous excitation of two slices. In principle this also applies to the excitation of more than two slices. A slice selection gradient 26 is switched during a slice selection time period 27, wherein the slice selection time period has a middle point in time that is represented by the dashed line 28. As is typical, the slice selection gradient likewise has a negative portion 26a that is essentially half as long as the positive portion and the refocusing of the excited spins. An RF excitation pulse that is radiated exactly at the middle point in time—i.e. that is symmetrical to the middle point in time and has the maximum at the middle point in time—would produce a slice excitation with complete rephasing of the magnetization along the slice normal. In slice multiplexing, two different RF excitation pulses are radiated, and a readout of the MR signals of the two slices (not shown) takes place simultaneously. The two shown RF excitation pulses—namely the RF excitation pulse 29 with the frequency ω1 and the RF excitation pulse 30 with the frequency ω2 that represent the portion of a slice multiplexing method with two simultaneously acquired slices—are offset by the times ΔT1 and ΔT2, respectively, relative to the middle point in time. As a result, a correction gradient moment of amplitude ΔT1 $G_S$ is impressed on the magnetization in the slice that was excited by the RF pulse 29, wherein $G_S$ is the strength of the slice selection gradient. A correction gradient moment of amplitude ΔT2 $G_S$ is likewise impressed on the magnetization in the slice that was excited by the RF pulse 30. In the shown example, ΔT2<0 would be applicable (i.e., ΔT2 is considered to have a negative sign). An arbitrary correction gradient moment can be generated via the selection of a corresponding time offset. In this way, in slice multiplex methods an individual action of a gradient along the slice selection axis can be achieved for each of the simultaneously considered slices. This simultaneously has the advantage that the energy radiated into the examination subject—known as the SAR—and the necessary RF peak power can be reduced via the temporal separation or, respectively, shift of the individual RF excitation pulses. The sole switching of an RF pulse to excite one of the slices without intersection with a 2nd RF pulse in order to be able to act individual on only one slice is not necessary. FIG. 2 shows the envelopes of the two RF pulses 29 and 30 that were necessary to excite the one respective slice. The resulting RF pulse with which two slices are excited simultaneously results from the complex addition of the time curve of amplitude and phase of the two individual pulses. If both maximums were situated at the same position (ΔT1=ΔT2), twice the peak RF amplitude would be required, and thus four times the SAR would be generated.

In connection with FIG. 3, it is described in the following how a linear phase change—the linear correction phase—can be achieved via application of a single correction gradient moment per slice. The method shown in FIG. 3 can be used to correct phase errors that are due to Maxwell fields and, for example, occur in diffusion imaging or flow imaging.

After the start of the method in Step S31, the necessary correction gradient moment $K_i$ along the slice normal is determined for each slice i in Step S32. The slice-specific correction gradient moment $K_i$ can be known beforehand or calculated. The number of slices to be acquired simultaneously is then selected in Step S33. For example, an optimally good separability of the slices can be used as a selection criterion in the in the aliasing process, which typically leads to a sufficient large interval of the slices. It is likewise possible to use an optimally high degree of similarity of the slice-specific correction gradient moment as a criterion so that the RF pulses must be shifted as little as possible counter to one another. On the other hand, it is possible to use a minimal difference of the necessary slice-specific correction gradient moment as an additional criterion in order to ensure a minimal interval of the RF pulses for the purpose of SAR reduction. "Minimal interval" as used herein means a "certain minimum interval", thus a compromise between a) sufficiently large separation to reduce the SAR and b) sufficiently small separation in order to not to significantly change the echo time. The aforementioned criteria for the selection of the number of slices can be used either individually or in combination.

A mean correction gradient moment is determined in Step S34. This mean correction gradient moment can be impressed in common on all slices, for example via an additional separate correction gradient moment. This can also be superimposed on a slice reversion gradient, just like the negative gradient segment 26a from FIG. 2. However, a separation in terms of time of this common portion is advantageous, but not absolutely necessary. The deviation from the mean correction gradient moment $M_K$ is determined in Step S35. This deviation represents the slice-individual auxiliary gradient moment $\Delta M_{Ki}$ for every simultaneously excited slice, wherein i is the slice index. The necessary time shift of the individual RF pulses is subsequently determined in Step S36. The RF pulses can be excitation, refocusing or storage RF pulses. Insofar as only the excitation RF pulse should be shifted, the shift is calculated as $\Delta T_i = \Delta M_{Ki}/G_S$ with $\Delta M_{Ki} = M_{Ki} - M_K$. If multiple RF pulses are used—for example as in spin echo experiments—each of these pulses can in principle be shifted. Ultimately, it must only be ensured that the previously calculated correction gradient moment $M_{Ki}$ is applied to the coherency path of the magnetization in slice i. A partial correction is also possible, for example if the time shift for a complete correction is too large for specific applications. In this case, the defined, slice-specific correction phase is not the phase that would theoretically be desired, but rather the phase that should be achieved in the concrete case. Finally, the implementation of the acquisition of the acquisition of the selected slices follows in Step S37, wherein the RF pulses with the calculated time shifts and the calculated communal correction gradient moment are used. In Step S38 a check is made as to whether all slices have been acquired. If this is not the case, the process continues with Step S33, wherein the loop is implemented until all desired slices have been acquired. The method ends in Step S39.

For a given slice thickness S, the amplitude GS of the slice selection gradient can be varied within certain limits via the bandwidth of the RF pulse BW. With $G_S = 2\pi\gamma \cdot BW/S$, wherein $\gamma$ is the gyromagnetic ratio. The time separation of the RF pulses can therefore be affected.

The method in which multiple different correction gradient moments are impressed on every slice is described in FIG. 4, wherein one of these can also be zero. The correction gradient moments can be identical for all slices; however, this is not an absolute requirement. In the method described in FIG. 4 it is also advantageous that a reduction of the SAR and the necessary peak RF power is achieved via clever arrangement of the RF pulses.

Before FIG. 4 is discussed in more detail, in FIG. 5 it is reviewed again how the different correction gradient moments were impressed in the prior art. As is shown in FIG. 5, an RF pulse 50a with a resonance frequency ω1 was radiated in a first slice given the switching of a slice selection gradient 51 with a positive portion 51a, a negative portion 51b and a portion 51c that corresponds to the slice-specific correction gradient moment. At the same time, an RF pulse with the resonance frequency ω2 (with the reference character 50b) is radiated for the second slice during a slice selection time period 53 with a middle point in time 54, simultaneously with the first RF pulse 50a. In a second acquisition, the respective RF pulses 50a and 50b are radiated with a second correction gradient moment 51d. As is apparent from FIG. 5, the complete superposition of the RF pulse envelopes leads to an increased peak RF power and an increased SAR. The disadvantages shown in FIG. 5 can be prevented with the embodiment of the invention shown in FIG. 6. The two RF pulses 60a and 60b, with respective resonance frequencies ω1 and ω2, are radiated time offset in a first measurement during the time period 62, while a slice selection gradient 61 with positive gradient moment 61a and negative gradient moment 61b is activated during the slice selection time period. The time offset with respect to the middle point in time 63 amounts to ΔT1 for pulse 60a, and amounts to ΔT2 relative to the middle point in time 63 for pulse 60b. The application of the additional gradient moment 51c or 51d from FIG. 5 is not necessary since a slice-specific correction gradient moment is generated via the time offset. In a second measurement it is then moved such that now the time shift of RF pulse 60a (in the upper example of FIG. 6) is assigned to the second RF pulse 60b, and vice versa. This means that each correction gradient moment of the other simultaneously acquired slice is impressed on each slice of each correction gradient moment. This method is explained again in detail in connection with FIG. 5. The j=2 . . . J correction gradient moments $M_{Kj}$ necessary for each slice are determined in Step S41 according to the state of the method in Step S40. As in Step S33, the number N of slices to be acquired simultaneously is selected in Step S42. In the simplest case, J is a whole-number multiple of N, with N equal to the number of simultaneously acquired slices. In Step S42—analogous to Step S34—a mean correction gradient moment $M_K$ is likewise determined that can be impressed on all measurements.

In Step S44, analogous to Step S35 the deviation of the mean correction gradient moment for each slice is determined with $\Delta M_{Kj} = M_{Kj} - M_K$. This deviation represents the correction gradient moments that are necessary for J measurements. In Step S45, the time shift of the individual RF pulses is determined in Step S45 analogous to Step S36, be they excitation pulses, refocusing pulses or storage pulses. Insofar as only the excitation RF pulses are shifted, the shift acts as $\Delta T_j = \Delta M_{Kj}/G_S$. This time shift must respectively be realized for each slice in a measurement. Otherwise, S45 is analogous to Step S36. The execution of a first acquisition of the selected slices with the calculated time shift and the calculated common mean correction gradient moment $M_K$ takes place in Step S46. In Step S47 a check is made as to whether all different correction gradient moments of the other slices were impressed on one slice. If this is not the case, a repetition of step S46 takes place with a permutation of the slice order. For example, in the example of N=3 and J=3, the following measurements are implemented in Steps S46 and S47: measurement 1: a time offset $\Delta T_1$ is used in slice 1, a time offset $\Delta T_2$ is used in slice 2 and a time offset $\Delta T_3$ is used in slice 3. In a further measurement of the same slices, the time shift $\Delta T_2$ is used in the first slice, the time shift $\Delta T_3$ is used in the second slice and the time shift $\Delta T_1$ is used in the third slice. In a third measurement, the time offset $\Delta T_3$ is applied in a first slice, the time offset $\Delta T_1$ is applied in the second slice and the time offset $\Delta T_2$ is applied in the third slice. In Step S48 a check is subsequently made as to whether all slices have been acquired, wherein Steps S42 through S48 are repeated until all slices have been acquired.

If J is a whole-number multiple of N, the permutation scheme can be adapted in a simple manner in Steps S46 and S47 if J=1, . . . , N is used in a first permutation series and J=N+1, . . . 2N is used in a second series etc.

Naturally, more complex permutation schemes can also be used. For example, if N=2 and J=3—meaning that J is not a whole-number multiple of N and four slices are acquired overall—this can be realized according to the following, for example:

| Measurement #1 | Slice #1 | $\Delta T_1$ | Slice #2 | $\Delta T_2$ |
| Measurement #2 | Slice #2 | $\Delta T_1$ | Slice #1 | $\Delta T_3$ |
| Measurement #3 | Slice #1 | $\Delta T_2$ | Slice #2 | $\Delta T_3$ |
| Measurement #4 | Slice #3 | $\Delta T_1$ | Slice #4 | $\Delta T_2$ |
| Measurement #5 | Slice #4 | $\Delta T_1$ | Slice #3 | $\Delta T_3$ |
| Measurement #6 | Slice #3 | $\Delta T_2$ | Slice #4 | $\Delta T_3$ |

Furthermore, with more complex sequences of permutations it is possible to take into account that the series of necessary, slice-specific correction gradient moments is specific to each slice i. For example, the total set of slices could be divided into P subsets for which the identical correction gradient moments $M_{Kj,p}$ should be applied. The workflow previously outlined in FIG. 4 can then be used for each of these subsets. The method shown in FIG. 4 ends in Step S49.

The method described in FIG. 4 can be used not only to correct unwanted phase effects, but also for phase coding itself if multiple separate 3D volumes oriented in parallel should be acquired (what is known as multi-slab imaging). In this case, the impression of a linear phase response takes place not only to correct an unwanted signal phase, but rather for the phase coding in 3D imaging. In the multiple separate 3D volumes, multiple excitations with different phase coding gradients in the slice coding direction must be implemented for each of these sub-volumes. This means that the linear correction phase in the sense of the present invention is not a correction phase, but rather is a phase coding phase, wherein the slice-specific correction gradient moment is in a sense not a correction gradient moment but rather a phase coding gradient moment that is impressed on the respective sub-volumes. In such a method, two sub-volumes are excited simultaneously via the time shift of the RF pulses as described above, wherein a different phase coding gradient is impressed on each sub-volume. The necessary phase coding step is subsequently implemented with suitable permutation for each sub-volume, as was described in connection with FIG. 4 for the different correction gradient moments. In such a method, the linear phase coding phase in the slice selection direction would be determined in one step for each slice or, respectively, for each sub-volume, wherein the RF pulses are selected such that the slice-specific phase coding gradient moment respectively acts in the slice selection direction in the sub-volumes, which slice-specific phase coding gradient moment corresponds to the specific linear phase coding phase of the respective slice. The phase coding gradients along the slice normal that are necessary in this method automatically result from the acquisition parameters, such as extent of the sub-volume in the direction of the slice normal and the resolution in this direction or, respectively, from the region of k-space to be acquired that is derived directly from said resolution in this direction.

In summary, the present invention enables a slice-specific correction of image artifacts in slice-multiplexing methods given simultaneous reduction of SAR and peak RF powers.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method that corrects a signal phase in a slice multiplexing data acquisition of magnetic resonance (MR) signals from a subject, wherein, for each of at least two slices of the object, from which MR signals are to be acquired in a slice multiplexing data acquisition sequence in which said at least two slices are respectively excited by radiating two radio-frequency (RF) pulses, each having a resonance frequency and the resonance frequencies differing from each other, in order to produce a different magnetization respectively in each of said at least two slices, while a slice selection gradient is activated, for a slice selection duration in a slice selection direction, said method comprising:

calculating, in a processor, a linear phase error along said slice selection direction, said linear phase error arising from slice-specific linear field deviations that occur along the slice selection direction due to magnetic fields other than said slice selection gradient that act on said at least two slices in the slice selection direction;

additionally in said processor, for each of said two RF pulses, also calculating a time offset, relative to a middle of said slice selection duration, with an offset amount that corrects said calculated linear phase error when a combination of said two RF pulses is radiated at the calculated time offsets, with said combination of said two RF pulses modifying a gradient moment that acts on said different magnetizations occurring in said at least two slices during said slice selection duration;

operating an MR data acquisition scanner from said processor in order to execute said slice multiplexing data acquisition sequence, including radiating said two RF pulses respectively at times corresponding to the respective, calculated time offsets and with a partial temporal overlap of said RF pulses that are radiated, while activating said slice selection gradient in said slice selection direction, so as to acquire said MR signals with said linear phase correction produced by said gradient moment, without altering or augmenting said activated slice selection gradient; and making the acquired MR signals available from the processor in electronic form, as a data file.

2. A method as claimed in claim 1 comprising, in said processor, determining, for each of said at least two different slices, a correction gradient moment that acts on the at least two different slices respectively, and determining a mean correction gradient moment that is applied to all of said at least two different slices from the respectively determined correction gradient moments for each of the said at least two respectively different slices, and determining a deviation, from the mean correction gradient moment, of the slice-specific correction gradient moment for each respective slice of said at least two different slices, with said deviation corresponding to a slice-individual auxiliary gradient moment and calculating said slice-individual auxiliary gradient moment, for each of said at least two different slices, so as to cause said slice-individual auxiliary gradient moment to act on each of the at least two respectively different slices respectively in the multiplexing data acquisition sequence.

3. A method as claimed in claim 1 comprising, in said processor, determining a number of said different slices according to at least one selection criterion that defines a spacing between said different slices.

4. A method as claimed in claim 1 comprising, in said processor, determining said time offset in order to produce said slice-specific correction gradient moment and in order to correct dephasing along a slice direction that occurs due to Maxwell fields.

5. A method as claimed in claim 4 comprising, in said processor, determining, for each of said at least two different slices, a correction gradient moment that acts respectively on the at least two different slices, and also determining a mean correction gradient moment that is applied to all of said at least two different slices from the respectively determined correction gradient moments for each of the said at least two respectively different slices, and determining a deviation, from the determined mean correction gradient moment, of the slice-specific correction gradient moment for each respective slice of said at least two different slices, said deviation corresponding to a slice-individual auxiliary gradient moment and calculating, said slice-individual auxiliary gradient moment for each of said at least two different slices, so as to cause said slice-individual auxiliary gradient moment to act on each of the at least two different slices respectively, and impress said mean correction gradient moment on said at least two different slices in the multiplexing data acquisition sequence by activating an additional correction gradient in the slice direction.

6. A method as claimed in claim 1 comprising, operating said MR data acquisition scanner from said processor in order to radiate multiple RF excitation pulses into each of said at least two different slices before acquiring MR signals therefrom, and radiating the multiple RF excitation pulses during respective slice selection time periods, of the multiplexing data acquisition sequence and selecting a number of said multiple RF excitation pulses along with the slice selection time periods in which they are respectively radiated in order to impress said slice-specific correction gradient moment as a whole on the magnetization of the at least two respective slices after radiating said multiple RF excitation pulses therein during the execution of the multiplexing data acquisition sequence.

7. A method as claimed in claim 1 comprising, operating said MR data acquisition scanner, with said processor, in order to impress a single-specific correction gradient moment onto each of said at least two different slices.

8. A method as claimed in claim 1 comprising, operating said MR data acquisition scanner, with said processor, in order to impress multiple different correction gradient moments on each of said at least two different slices, with all of said different correction gradient moments being impressed onto each of said at least two different slices simultaneously.

9. A method as claimed in claim 8 comprising, from said processor operating said MR data acquisition scanner in order to impress J correction gradient moments (J≥2) on each of said at least two different slices and acquiring MR data from N different slices simultaneously, with N being a whole-number multiple of J, and impressing a slice-specific correction gradient moment on each slice during a step of said slice multiplexing sequence, and repeating said step with permutation of a slice sequence until said J correction gradient moments are impressed onto each of said at least two different slices.

10. A method as claimed in claim 1 comprising, operating said MR data acquisition scanner, with said processor, in order to radiate said two RF excitation pulses as excitation pulses for selection of the at least two slices of the examination subject.

11. A method as claimed in claim 1 comprising, operating said MR data acquisition scanner, with said processor, in order to radiate said two RF excitation pulses as refocusing pulses within a multiplexed spin echo, signal generation sequence.

12. A method as claimed in claim 1 comprising, operating said MR data acquisition scanner, with said processor, in order to radiate said two RF excitation pulses as storage pulses within a multiplexed echo signal generation sequence.

13. A magnetic resonance (MR) apparatus that corrects a signal phase in a slice multiplexing data acquisition of MR signals from a subject, said apparatus comprising:
an MR data acquisition scanner;
a processor;
said processor being configured to operate said MR data acquisition scanner so as to execute a slice multiplexing data acquisition sequence wherein, for each of at least two slices of the object, MR signals are acquired in said slice multiplexing data acquisition sequence by said at least two slices being respectively excited by radiating two radio-frequency (RF) pulses, each having a resonance frequency and the resonance frequencies differing from each other, in order to produce a different magnetization respectively in each of said at least two slices, while a slice selection gradient is activated, for a slice selection duration in a slice selection direction;
said processor being configured to calculate a linear phase error along the slice selection direction, said linear phase error arising from slice-specific linear field deviations that occur along the slice selection direction due to magnetic fields other than said slice selection gradient that act on said at least two slices in the slice selection direction;
additionally in said processor, for each of said two RF pulses, also calculating a time offset, relative to a middle of said slice selection duration, with an offset amount that corrects said calculated linear phase error when a combination of said two RF pulses is radiated at the calculated time offsets, with said combination of said two RF pulses modifying a gradient moment that acts on said different magnetizations occurring in said at least two slices during said slice selection duration;
said processor being further configured to operate said MR data acquisition scanner in order to execute said slice multiplexing data acquisition sequence, including radiating said two RF pulses respectively at times corresponding to the respective, calculated time offsets, while activating said slice selection gradient in said slice selection direction and with a partial temporal overlap of RF pulses said two that are radiated, so as to acquire said MR signals with said linear phase correction produced by said gradient moment, without altering or augmenting said activated slice selection gradient; and
said processor being configured to make the acquired MR signals available from the processor in electronic form, as a data file.

* * * * *